(12) United States Patent
Dubin et al.

(10) Patent No.: US 10,249,588 B2
(45) Date of Patent: Apr. 2, 2019

(54) DESIGNS AND METHODS FOR CONDUCTIVE BUMPS

(71) Applicant: Intel Corporation, Santa Clara, CA (US)

(72) Inventors: Valery M. Dubin, Portland, OR (US); Sridhar Balakrishnan, Portland, OR (US); Mark Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/369,815

(22) Filed: Dec. 5, 2016

(65) Prior Publication Data

US 2017/0084564 A1    Mar. 23, 2017

Related U.S. Application Data

(60) Continuation of application No. 12/973,615, filed on Dec. 20, 2010, now Pat. No. 9,543,261, which is a
(Continued)

(51) Int. Cl.
*H01L 23/00* (2006.01)
*H01L 21/288* (2006.01)
*H01L 21/48* (2006.01)

(52) U.S. Cl.
CPC ............ *H01L 24/13* (2013.01); *H01L 21/288* (2013.01); *H01L 21/4853* (2013.01);
(Continued)

(58) Field of Classification Search
CPC ... H01L 24/13; H01L 21/288; H01L 21/4853; H01L 24/05; H01L 24/11; H01L 2224/0401; H01L 2224/05124
(Continued)

(56) References Cited

U.S. PATENT DOCUMENTS

| 4,880,708 A | 11/1989 | Sharma et al. |
| 5,346,118 A | 9/1994 | Degani et al. |

(Continued)

FOREIGN PATENT DOCUMENTS

| CN | 1320960 | 11/2001 |
| EP | 1 148 548 | 10/2001 |

(Continued)

OTHER PUBLICATIONS

Notice of Allowance (3 pages) dated Jan. 4, 2017 from the Japanese Patent Office for Japanese Patent Application No. 2015-106328.
(Continued)

*Primary Examiner* — Ori Nadav
(74) *Attorney, Agent, or Firm* — Schwabe, Williamson & Wyatt, P.C.

(57) ABSTRACT

Methods, techniques, and structures relating to die packaging. In one exemplary implementation, a die package interconnect structure includes a semiconductor substrate and a first conducting layer in contact with the semiconductor substrate. The first conducting layer may include a base layer metal. The base layer metal may include Cu. The exemplary implementation may also include a diffusion barrier in contact with the first conducting layer and a wetting layer on top of the diffusion barrier. A bump layer may reside on top of the wetting layer, in which the bump layer may include Sn, and Sn may be electroplated. The diffusion barrier may be electroless and may be adapted to prevent Cu and Sn from diffusing through the diffusion barrier. Furthermore, the diffusion barrier may be further adapted to suppress a whisker-type formation in the bump layer.

20 Claims, 9 Drawing Sheets

Related U.S. Application Data continuation of application No. 11/894,627, filed on Aug. 20, 2007, now Pat. No. 8,580,679, which is a division of application No. 10/668,986, filed on Sep. 22, 2003, now Pat. No. 7,276,801.

(52) U.S. Cl.
CPC .............. *H01L 24/05* (2013.01); *H01L 24/11* (2013.01); *H01L 2224/0401* (2013.01); *H01L 2224/05124* (2013.01); *H01L 2224/1145* (2013.01); *H01L 2224/11452* (2013.01); *H01L 2224/11462* (2013.01); *H01L 2224/11464* (2013.01); *H01L 2224/11614* (2013.01); *H01L 2224/1312* (2013.01); *H01L 2224/13026* (2013.01); *H01L 2224/13084* (2013.01); *H01L 2224/13099* (2013.01); *H01L 2224/13111* (2013.01); *H01L 2224/13113* (2013.01); *H01L 2224/13139* (2013.01); *H01L 2224/13147* (2013.01); *H01L 2224/13166* (2013.01); *H01L 2224/13564* (2013.01); *H01L 2224/13611* (2013.01); *H01L 2224/13639* (2013.01); *H01L 2224/13647* (2013.01); *H01L 2224/29111* (2013.01); *H01L 2924/014* (2013.01); *H01L 2924/01005* (2013.01); *H01L 2924/01006* (2013.01); *H01L 2924/01013* (2013.01); *H01L 2924/01015* (2013.01); *H01L 2924/01022* (2013.01); *H01L 2924/01023* (2013.01); *H01L 2924/01024* (2013.01); *H01L 2924/01027* (2013.01); *H01L 2924/01029* (2013.01); *H01L 2924/01033* (2013.01); *H01L 2924/01042* (2013.01); *H01L 2924/01044* (2013.01); *H01L 2924/01045* (2013.01); *H01L 2924/01047* (2013.01); *H01L 2924/01051* (2013.01); *H01L 2924/01057* (2013.01); *H01L 2924/01058* (2013.01); *H01L 2924/01074* (2013.01); *H01L 2924/01076* (2013.01); *H01L 2924/01077* (2013.01); *H01L 2924/01078* (2013.01); *H01L 2924/01079* (2013.01); *H01L 2924/01082* (2013.01); *H01L 2924/01327* (2013.01); *H01L 2924/04941* (2013.01); *H01L 2924/14* (2013.01); *H01L 2924/3011* (2013.01); *H01L 2924/351* (2013.01); *H01L 2924/35121* (2013.01); *H01L 2924/3651* (2013.01)

(58) Field of Classification Search
USPC .......................................................... 438/597
See application file for complete search history.

(56) References Cited

U.S. PATENT DOCUMENTS

| | | | |
|---|---|---|---|
| 5,376,584 A | 12/1994 | Agarwala | |
| 5,384,283 A | 1/1995 | Gegenwarth et al. | |
| 5,470,787 A | 11/1995 | Greer | |
| 5,530,286 A | 6/1996 | Murakami et al. | |
| 5,629,564 A | 5/1997 | Nye et al. | |
| 5,775,569 A | 7/1998 | Berger et al. | |
| 6,149,122 A | 11/2000 | Berger et al. | |
| 6,181,012 B1 | 1/2001 | Edelstein et al. | |
| 6,218,281 B1 | 4/2001 | Watanabe et al. | |
| 6,285,083 B1 | 9/2001 | Imai et al. | |
| 6,335,104 B1 | 1/2002 | Sambucetti et al. | |
| 6,433,427 B1 | 8/2002 | Wu et al. | |
| 6,528,409 B1 | 3/2003 | Lopatin et al. | |
| 6,548,898 B2 | 4/2003 | Matsuki et al. | |
| 6,614,590 B2 | 9/2003 | Tatoh | |
| 6,639,315 B2 | 10/2003 | Kazama et al. | |
| 6,689,639 B2 | 2/2004 | Sakuyama et al. | |
| 6,716,736 B2 | 4/2004 | Chen et al. | |
| 6,740,577 B2 | 5/2004 | Jin et al. | |
| 6,797,312 B2 | 9/2004 | Kong et al. | |
| 6,827,252 B2 | 12/2004 | Tong et al. | |
| 6,893,799 B2 | 5/2005 | Danovitch et al. | |
| 8,546,756 B2 | 10/2013 | Shur et al. | |
| 2001/0008160 A1* | 7/2001 | Suzuki | B23K 3/0623 156/64 |
| 2001/0012570 A1 | 8/2001 | Egitto | |
| 2002/0017790 A1 | 2/2002 | Holmes, IV et al. | |
| 2002/0063332 A1* | 5/2002 | Yamaguchi | H01L 23/3114 257/738 |
| 2002/0127790 A1 | 9/2002 | Hongo et al. | |
| 2003/0013290 A1 | 1/2003 | Greer | |
| 2003/0025202 A1 | 2/2003 | Mikage et al. | |
| 2003/0057551 A1 | 3/2003 | Datta et al. | |
| 2003/0136814 A1 | 7/2003 | Furman et al. | |
| 2003/0155406 A1 | 8/2003 | Tong et al. | |
| 2003/0219966 A1 | 11/2003 | Jin et al. | |
| 2005/0156315 A1 | 7/2005 | Lee et al. | |
| 2007/0267651 A9 | 11/2007 | Kobayashi et al. | |
| 2012/0267241 A1 | 10/2012 | Fredenberg et al. | |

FOREIGN PATENT DOCUMENTS

| | | |
|---|---|---|
| JP | 4-92432 | 3/1992 |
| JP | 2005-175275 | 7/1993 |
| JP | 6-140406 | 5/1994 |
| JP | 2008-203020 A | 8/1996 |
| JP | 2011-219946 A | 8/1999 |
| JP | 11-340229 | 12/1999 |
| JP | 2000-101014 | 4/2000 |
| JP | 2000-188305 | 7/2000 |
| JP | 2000-252313 | 9/2000 |
| JP | 2000-353703 A | 12/2000 |
| JP | 2001-085390 A | 3/2001 |
| JP | 2001-93928 | 4/2001 |
| JP | 2001-168515 | 6/2001 |
| JP | 2001-267356 | 9/2001 |
| JP | 2001-320013 A | 11/2001 |
| JP | 2002-76046 | 3/2002 |
| JP | 2002-203925 | 7/2002 |
| JP | 2002-231855 A | 8/2002 |
| JP | 2003-007755 | 1/2003 |
| JP | 2003-124216 A | 4/2003 |
| JP | 2003-197665 | 7/2003 |
| JP | 2003-203941 A | 7/2003 |
| JP | 2003-273158 A | 9/2003 |
| JP | 2004-330784 A | 11/2004 |
| JP | 2006-140409 A | 6/2006 |
| JP | 2010-267996 | 11/2010 |
| JP | 2011-510321 A | 3/2011 |
| WO | WO 20030009379 | 1/2003 |

OTHER PUBLICATIONS

Appeal Decision (16 pages) from the Japan Patent Office dated Nov. 29, 2016 for Japanese Patent Application No. 2015-9733 and English Translation (3 pages) thereof.

First Official Action from the Japanese Patent Office dated Apr. 28, 2016, Japanese Patent Application No. 2015-106238 and English Translation thereof.

First Official Action from the Japanese Patent Office dated Mar. 16, 2016, Japanese Patent Application No. 2013-079553 and English Translation thereof.

English Translation of Decision to Refuse from the Japan Patent Office dated Jan. 26, 2015, Japanese Patent Application No. 2013-079553 and English Translation thereof.

Eisenberg, H.R. et al., "Origin and Properties of the Wetting Layer and Early Evolution of Epitaxially Strained Thin Films", Physical Review B, 66(155429): 1-13, (2002).

Eisenberg, H.R. et al., "Wetting Layer Thickness and Early Evolution of Epitaxially Strained Thin Films", Physical Review Letters, 85(6): 1286-1289, Aug. 2002.

Kariya, Y. et al., "Tin Pest in Sn-0.5 wt.% Cu Lead-Free Solder", JOM, pp. 39-41, Jun. 2001.

(56) References Cited

OTHER PUBLICATIONS

Smith, R.W., "The White Tin-Grey Tin Transition in Tin-Mercury Alloys", Canadian Journal of Physics, vol. 38, pp. 588-592 (1960).
The Farada Society, Discussion of the Faraday Society: Molecular Mechanism of Rate Processes in Solids, The Aberdeen University Press Ltd., No. 23, 1957.
Office Communication dated Aug. 24, 2004, U.S. Appl. No. 10/668,986, filed Sep. 22, 2003, Valey M. Dubin.
Office Communication dated Feb. 24, 2005, U.S. Appl. No. 10/668,986, filed Sep. 22, 2003, Valey M. Dubin.
Office Communication dated Oct. 6, 2005, U.S. Appl. No. 10/668,986, filed Sep. 22, 2003, Valey M. Dubin.
Office Communication dated Apr. 20, 2006, U.S. Appl. No. 10/668,986, filed Sep. 22, 2003, Valey M. Dubin.
Office Communication dated Aug. 9, 2006, U.S. Appl. No. 10/668,986, filed Sep. 22, 2003, Valey M. Dubin.
Office Communication dated Dec. 13, 2006, U.S. Appl. No. 10/668,986, filed Sep. 22, 2003, Valey M. Dubin.
Office Communication dated Feb. 22, 2010, U.S. Appl. No. 11/894,627, filed Aug. 20, 2007, Valey M. Dubin.
Office Communication dated Sep. 1, 2010, U.S. Appl. No. 11/894,627, filed Aug. 20, 2007, Valey M. Dubin.
International Preliminary Report on Patentability and Written Opinion received for PCT Patent Application No. PCT/US2004/030577, dated Apr. 6, 2006, 9 pages.
Office Action from Chinese Patent Application No. 200480027161.4 dated Sep. 21, 2007, 14 pages.
Office Action from Chinese Patent Application No. 200480027161.4 dated Jul. 4, 2008, 10 pages.
Notice of Allowance from Chinese Patent Application No. 200480027161.4 dated Jan. 23, 2009, 4 pages.
Office Action from Japanese Patent Application No. 2006-527074, dated Jan. 20, 2009, 7 pages.
Office Action from Japanese Patent Application No. 2006-527074, dated Mar. 30, 2010, 9 pages.
Notice of Allowance from Japanese Patent Application No. 2006-527074, dated Oct. 15, 2010, 3 pages.
Office Action from Japanese Patent Application No. 2010-172138, dated Jan. 8, 2013, 7 pages.
Notice of Allowance from Japanese Patent Application No. 2010-172138, dated Apr. 30, 2013, 3 pages.
Office Action from Japanese Patent Application No. 2013-079553, dated Apr. 15, 2014, 9 pages.
Office Action from Japanese Patent Application No. 2013-079553, dated Feb. 3, 2015, 7 pages.
Office Action from Japanese Patent Application No. 2013-079553, dated Mar. 22, 2016, 22 pages.
Office Action from Japanese Patent Application No. 2013-079553, dated Nov. 29, 2016, 19 pages.
Office Action from Japanese Patent Application No. 2015-106328, dated May 10, 2016, 4 pages.
Office Action from Japanese Patent Application No. 2015-106328, dated Jan. 4, 2017, 3 pages.
International Search Report and Written Opinion for PCT/US2004/030577, dated Jan. 7, 2007, 9 pages.
Office Action for Taiwan Patent Application No. 93128593, dated Jun. 17, 2005, 4 pages.
Office Action for U.S. Appl. No. 12/973,615 dated Oct. 12, 2011, 5 pages.
Office Action for U.S. Appl. No. 12/973,615, dated Aug. 20, 2013, 6 pages.
Office Action for U.S. Appl. No. 12/973,615, dated Dec. 2, 2018, 7 pages.
Office Action for U.S. Appl. No. 12/973,615, dated Apr. 8, 2014, 7 pages.
Office Action for U.S. Appl. No. 12/973,615, dated Jul. 30, 2014, 7 pages.
Office Action for U.S. Appl. No. 12/973,615, dated Jan. 29, 2015, 11 pages.
Office Action for U.S. Appl. No. 12/973,615, dated Jun. 10, 2015, 12 pages.
Office Action for U.S. Appl. No. 12/973,615, dated Oct. 26, 2015, 9 pages.
Office Action for U.S. Appl. No. 12/973,615, dated Feb. 12, 2016, 10 pages.
Office Action for U.S. Appl. No. 11/894,627, dated Feb. 22, 2010, 6 pages.
Office Action for U.S. Appl. No. 11/894,627, dated Sep. 1, 2010, 8 pages.
Office Action for U.S. Appl. No. 11/894,627, dated Mar. 13, 2012, 6 pages.
Office Action for U.S. Appl. No. 11/894,627, dated Jan. 17, 2013, 8 pages.
Office Action for U.S. Appl. No. 11/894,627, dated Jul. 18, 2011, 7 pages.
Notice of Allowance for Taiwan Patent Application No. 93128593, dated Jan. 4, 2006, 2 pages.

* cited by examiner

DESIGNS AND METHODS FOR CONDUCTIVE BUMPS

This is a Continuation of application Ser. No. 12/973,615 file Dec. 20, 2010 which is a Continuation of application Ser. No. 11/894,627, filed Aug. 20, 2007 now U.S. Pat. No. 8,580,679 issued Nov. 12, 2013 which is a Divisional application of Ser. No. 10/668,986, filed Sep. 22, 2003 now U.S. Pat. No. 7,276,801, Issued on Oct. 2, 2007.

TECHNICAL FIELD

This specification relates to semiconductor process fabrication, and more particularly to fabricating bumps for integrated circuits, as in die packaging.

BACKGROUND

During a die packaging process, several conductive layers may be placed between the substrate of a die and the surrounding package. The die package can be soldered with a conductive layer and the soldered layer may contact a lower-level conducting layer. The lower-level conducting layer may be patterned to have one or more conducting bumps, and may be referred to as a "bump" layer. A bump may contact a base layer metal (BLM) that is directly or indirectly connected to the substrate. The bump and the base layer metal may have one or more properties that may result in one or more electromigration issues or degradation of the layers.

DETAILED DESCRIPTION

Figure 1A:
FIGS. 1A-1D show exemplary defective bump diagrams.

The techniques, methods, and structures of one or more exemplary implementations in the present disclosure relate to integrated circuits and die packaging. In particular, one or more exemplary implementations relate to fabricating bumps on a substrate to prevent Cu and Sn intermixing. One or more exemplary implementations in the present disclosure may reduce a number of electromigration issues relating to CuSn intermetallic formation, and may reduce the formation of whiskers in one or more layers.

The details of one or more exemplary implementations are set forth in the accompanying drawings and the description below. In one exemplary implementation, an apparatus comprises a semiconductor substrate and a first conducting layer in contact with the semiconductor substrate. The first conducting layer may comprise a base layer metal, such as Cu. The apparatus further comprises a diffusion barrier in contact with the first conducting layer, a wetting layer on top of the diffusion barrier, and a bump layer on top of the wetting layer. The bump layer may include Sn, and the Sn bump layer may be electroplated. The diffusion barrier may prevent Cu and Sn from diffusing through the diffusion barrier. The diffusion barrier may also be able to suppress a whisker-type formation in the bump layer. Other features and advantages of one or more exemplary implementations will be apparent from the description and drawings, and from the claims.

In semiconductor wafer processing, devices and interconnects are formed on a substrate and are electrically connected to a die package. An electrical connection to a die package may be achieved with a conducting solder layer between the die package and a lower-level conducting interconnect layer on the wafer. The solder layer may oftentimes include Sn or a Sn alloy. The conducting interconnect layer, or an adjacent conducting layer, may oftentimes include Cu. In some cases, the conducting interconnect layer may be the lowest level metal layer or the metal layer that is in closest proximity to the substrate. Such a metal layer may be referred to as a base layer metal (BLM). In some cases, the base layer metal may be used as a diffusion barrier to prevent solder from migrating into a lower-level pad of the die. The pad of the die may include one or more layers of metal, such as an Al layer. In one or more exemplary implementations of the present disclosure, a layer may be formed on top of the base layer metal to serve as a diffusion barrier between Cu in the base layer metal and Sn in a layer above the diffusion barrier.

A die package interconnect structure with Sn in one layer and Cu in a nearby layer may result in one or more detrimental issues for the die package interconnect. Some of these detrimental issues may degrade the electrical and mechanical properties of the die package interconnect, reduce the yield of forming such interconnects, or even form irregular, unintended regions such as whiskers and delaminations. Delamination may involve the degradation or the physical separation of one or more layers. Some of these detrimental issues are exemplified in FIGS. 1A-1D and are described below.

Figure 1B:
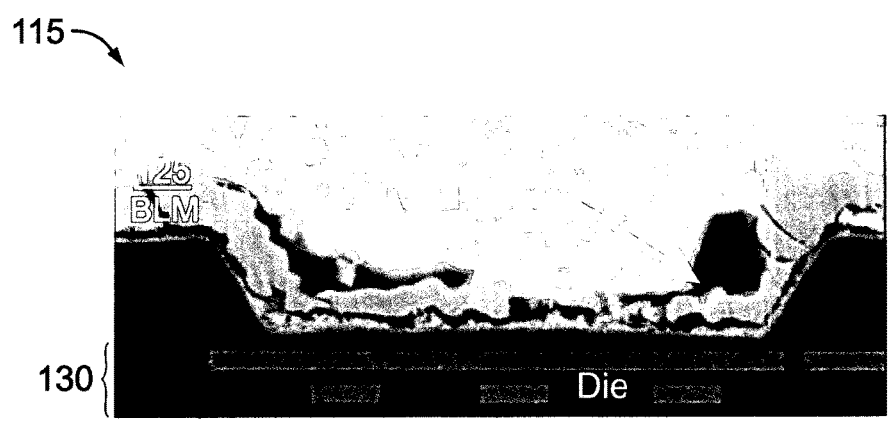

FIGS. 1A-1B present diagrams of a die package interconnect with an exemplary bump delamination. The bump 110 in the diagram of FIG. 1A is a solder region that includes a Sn alloy, PbSn. As shown in a marked region 115, a bump 110 may conform to the shape of the lower interconnect or the base layer metal 125. The bump 110 may contact and cover the edges and sidewalls of lower interconnects or the base layer metal.

FIG. 1B is a diagram of the region 115 in which the base layer metal 125, the PbSn bump 110, and the die substrate area 130 are presented. In this diagram, delamination occurs in the layers 125, 110 between the substrate 130 and the bump 110. Such delamination may result from one or more properties of the base layer metal 125. The base layer metal 125 may be constructed in such a manner that the base layer metal 125 may degrade during baking or thermal processing. Degradation and delamination may reduce the conducting surface area between the layers 125, 110 and create electromigration-related failures.

Some failures in die package interconnects may be electromigration-related failures and other failures may be due to the properties of the layer materials and the interfacing of layers. Some electromigration-related failures may be due to the metallurgical properties of the layers 125, 110, increased heat and thermal issues, and the growth of one or more voids 120 between the layers 125, 110. Electromigration in region 115 may create higher current densities and increase electromagnetic stress. As described below in one or more exemplary implementations, methods, structures, and techniques are presented to reduce electromigration-related die package interconnect failures.

Certain metallurgical properties of one or more layers of die package interconnects may result in die package interconnect failure. Examples of such metallurgical properties include non-conforming surfaces, phase transitions of materials at different temperatures, and diffusion and intermixing of elements of different layers. For instance, Sn can be a common metal used in one or more die package interconnect layers. However, Sn may exist in two allotropes at different temperatures. Above a temperature of about 13.2° C., the hard, shiny, and conductive alpha Sn (tetragonal structure, α-phase Sn) may be in a stable phase. When the temperature is below 13.2° C., beta Sn (diamond cubic structure, β phase Sn) may be thermodynamically favorable. The alpha phase is a preferred phase in a layer structure. The alpha to beta phase transformation may be accompanied by a 26% volume increase due to different densities of two phases. The change in volume in the phase transition may deform the interface between Sn and other layers. Also, beta Sn is in powder form and does not have the mechanical strength for an interconnect. Hence, when the Sn is in beta phase, the mechanical strength of the Sn layer and the interconnect deteriorates. For at least the above reasons, a Sn layer or interconnect can transition from alpha phase to beta phase during low temperatures and may lead to interconnect failure. As described below in one or more exemplary implementations, methods, techniques, and structures are presented to prevent low temperature phase transition of Sn.

Although bump 110 is shown as a solder bump in 100, the bump may be a bump or a bump layer that is not a solder layer, but a layer adjoining a solder layer. Moreover, the bump 110 may not be directly contacting the die package 105. As described in the figures below, the bump or bump layer could include other materials, such as Cu, and may contact directly to the base layer metal or other layer interconnects.

Figure 1C:
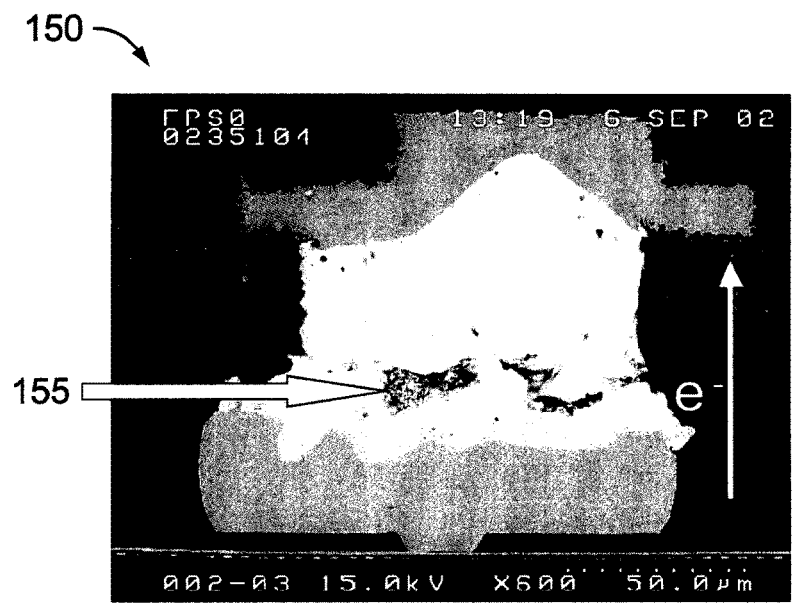
Figure 1D:
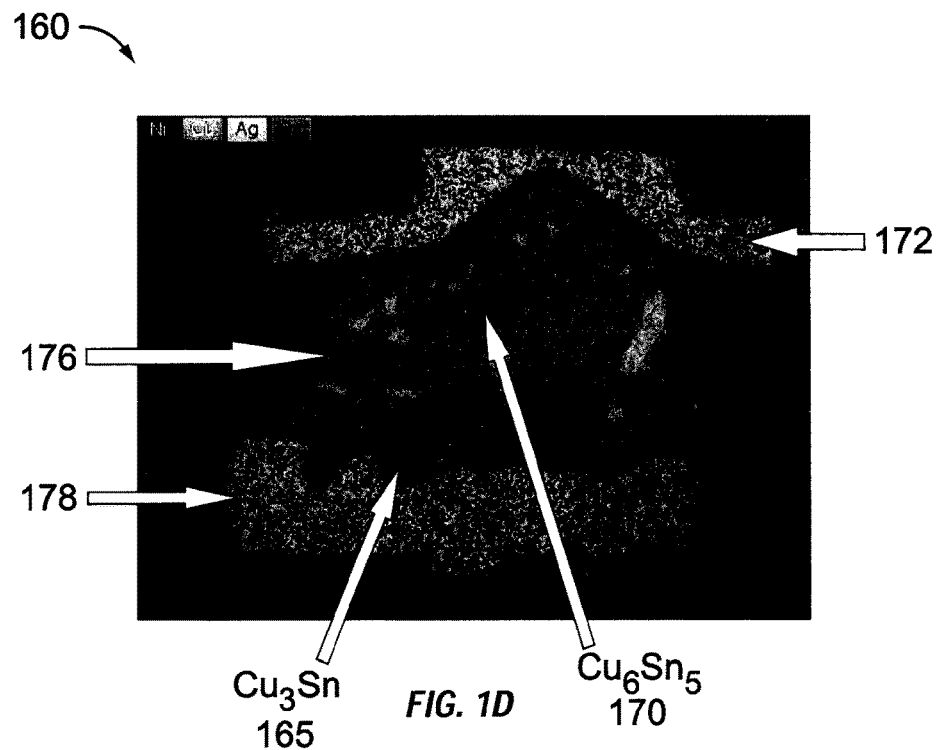

FIGS. 1C-1D present examples of the undesirable intermixing of Cu and Sn of different layers. For instance, FIG. 1C shows a diagram of a die package interconnect 150 with a void 155 in a solder layer. Diffusion or intermixing of Cu and Sn from different layers may form CuSn intermetallics and may help to create the void 155. The electrical resistance in the interconnect 150 may increase due to voiding in the solder and may result in electromigration problems. Other undesirable formations, such as whiskers, may also form due to the intermixing of Cu and Sn. The whiskers may result in compressive stress build up in Sn bumps and may lead to die package interconnect failure.

FIG. 1D shows another exemplary diagram 160 of various layers of a die package interconnect with diffused or intermixed Cu and Sn. FIG. 1D shows examples of Cu and Sn formation. For instance, a region 165 of $Cu_3Sn$ and a region 170 of $Cu_6Sn_5$ have formed between layers of Cu 172, 178 and Sn 176 in the diagram 160.

Some conventional techniques attempt to prevent the intermixing and diffusion of Cu and Sn from different die package interconnect layers. For instance, the use of Pb5Sn bumps may be used to prevent whisker formation. However, the use of Pb5Sn bumps may have electromigration issues that may result from low temperature phase transition of Sn, as described above. Moreover, Pb may contribute to environmental and health issues. In another conventional example, sputtered Ni may be used to prevent Cu diffusing into Sn. However, sputtered Ni has poor diffusion barrier properties and does not adequately prevent Cu and Sn diffusion or intermixing. As described below in one or more exemplary implementations, methods, techniques, and structures are presented to prevent the diffusion and intermixing of Cu and Sn between different die package interconnect layers.

One or more exemplary implementations in the present disclosure also present methods, techniques, and structures to prevent degradation of Sn bumps during etching of the base layer metal. In general, the corrosion and oxidation of the Sn bumps may be prevented during etching of a base layer metal that includes Ti, Al, or NiV.

Figure 2:
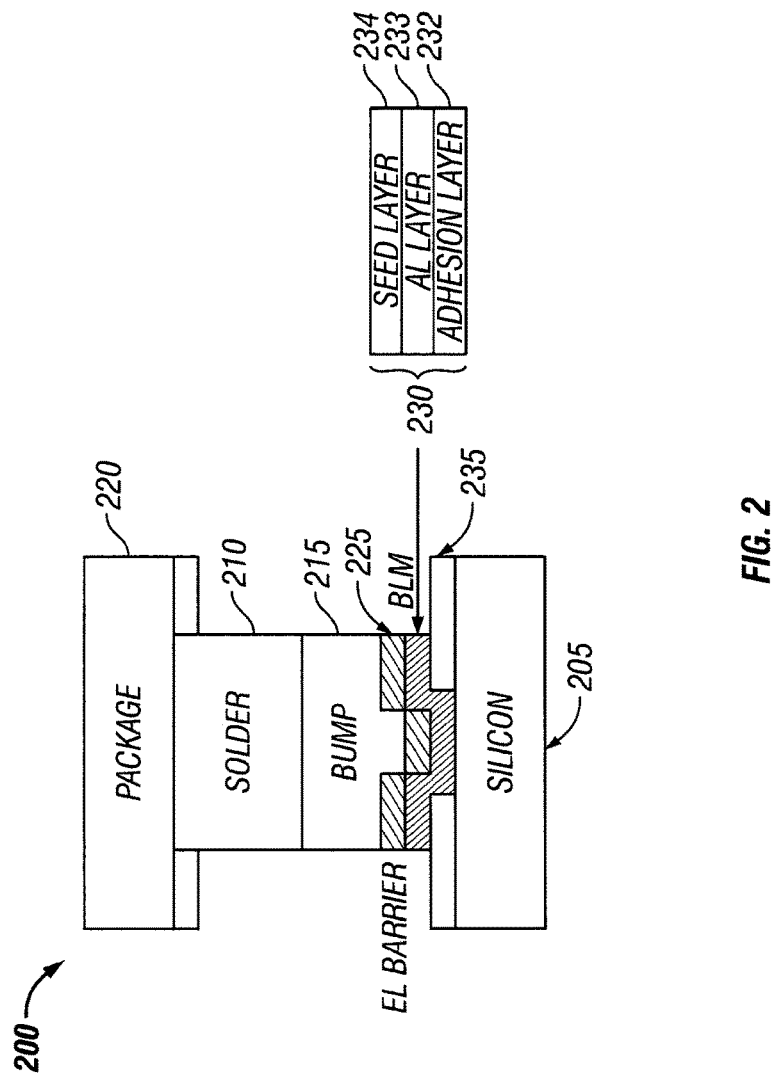
FIG. 2 shows an exemplary implementation of the fabricated structure.

FIG. 2 shows an exemplary implementation of a die package interconnect. A base layer metal 230 is formed on top of a silicon substrate 205 and the base layer metal 230 may include Cu. The base layer metal 230 may also be formed on top of a patterned insulator, resin, or dielectric layer 235, such as a polyimide layer. The base layer metal 230 may include an adhesion layer 232 and a seed layer 234. The adhesion layer 232 may be formed, for example, on the substrate 205 or a dielectric layer 235. The adhesion layer 232 may help in the joining or attaching of two different surfaces, such as helping the base layer metal to stick to the underlying surface. The seed layer 234 may help to build up the base layer metal structure on top of the adhesion layer 232. The seed layer may serve as a smooth interface to an underlying layer and may facilitate correct growth and formation of the base layer metal. The adhesion layer 232 may include Ti, TiN, and TiSiN and the seed layer 234 may include Ni, NiV, and Co. An additional metal layer, such as an Al layer 233, may be formed between the adhesion layer 232 and the seed layer 234 in order to improve one or more properties of the base layer metal. The improvement of the base layer metal properties with the additional metal layer may include the suppression of whisker formations and the prevention of layer delamination and degradations during thermal processing and electromagnetic stress.

A diffusion barrier layer 225 can be selectively positioned on top of the base layer metal 230. Selective deposition may mean that some surfaces may have another layer deposited only on a portion of that surface. The electroless diffusion barrier can prevent Cu and Sn from diffusing through the diffusion barrier. The diffusion barrier layer 225 may be electroless and located in a position to prevent the intermixing of Cu from the base layer metal 230 and Sn from the bump layer 215 or solder layer 210. The diffusion barrier layer 225 may prevent CuSn intermetallic formation and whisker formation. The diffusion barrier layer 225 may prevent bump delamination and improve the processing yield of fabricating die package interconnects. The diffusion barrier layer 225 may include, among others, any one of CoBP, CoWP, CoWB, CoWBP, NiBP, NiWP, NiWB, and NiWBP.

Electroless deposits may offer one or more advantages when deposited on irregularly shaped objects, patterns, and recesses. In electroless plating, electrons are supplied by a chemical reducing agent. In general, electroless plating may refer to a reduction of metal ions from a solution containing a reducing agent. The reducing agent can supply electrons by oxidation on a catalytic surface. Electroless deposits may have high uniformity and little to no compressive stress during plating. Electroless deposits tend to be uniform in thickness over all of the shape of the underlying structure, therefore providing more uniform current densities and reducing some electromigration issues. Electroless barriers may also offer the advantages of being low cost, selective, and amorphous.

The diffusion barrier may have other materials that may prevent or inhibit the diffusion of Sn with Cu through the diffusion barrier. For example, platable materials having slow reaction or diffusion with Sn and Cu may be used, such as metals from group VIII (e.g., Co, Ni, Fe, Ru, Rh, Ir, and Os) alloying with Group VI (e.g., W, Mo, and Cr) and metalloid (e.g., B, P, and N).

A wetting layer (not shown) may be placed on top to the diffusion barrier layer 225. The wetting layer may also be selectively deposited on portions of the diffusion barrier layer 225. The wetting layer may include any one of CoB, NiB, and NiP.

A bump layer 215 is placed on top of the wetting layer and a solder layer 210 is placed on top of the bump layer 215. The die package 220 is on top of and electrically connected to the solder layer 210. Electrical connection to the die package 220 may allow current to flow between the die package and devices and interconnects near or on the substrate. Sn may be in the bump layer 215, the solder layer 210, or in both layers 210, 215.

In one or more exemplary implementations in the present disclosure, Sn may be electroplated to suppress whisker formation and related electromigration failures. The electroplating of Sn may also prevent low temperature (e.g., around 13.2° C.) phase transition of Sn and prevent mechanical and electromigration failures related to beta Sn. The electroplating of Sn may include Sn and the alloys of Sn, such as 0.7 Cu, Bi, Sb, and 3.5 Ag. Sn may be electroplated at a constant current (e.g., around 10-100 mA/cm2) or voltage from a solution containing Sn salt (e.g., Sn sulfate, Sn chloride), acid (e.g., sulfuric acid, sulfonic acid), and other additives (e.g., a suppressor, such as polyether glycol or grain refiner and an anti-oxidant).

Figure 3:
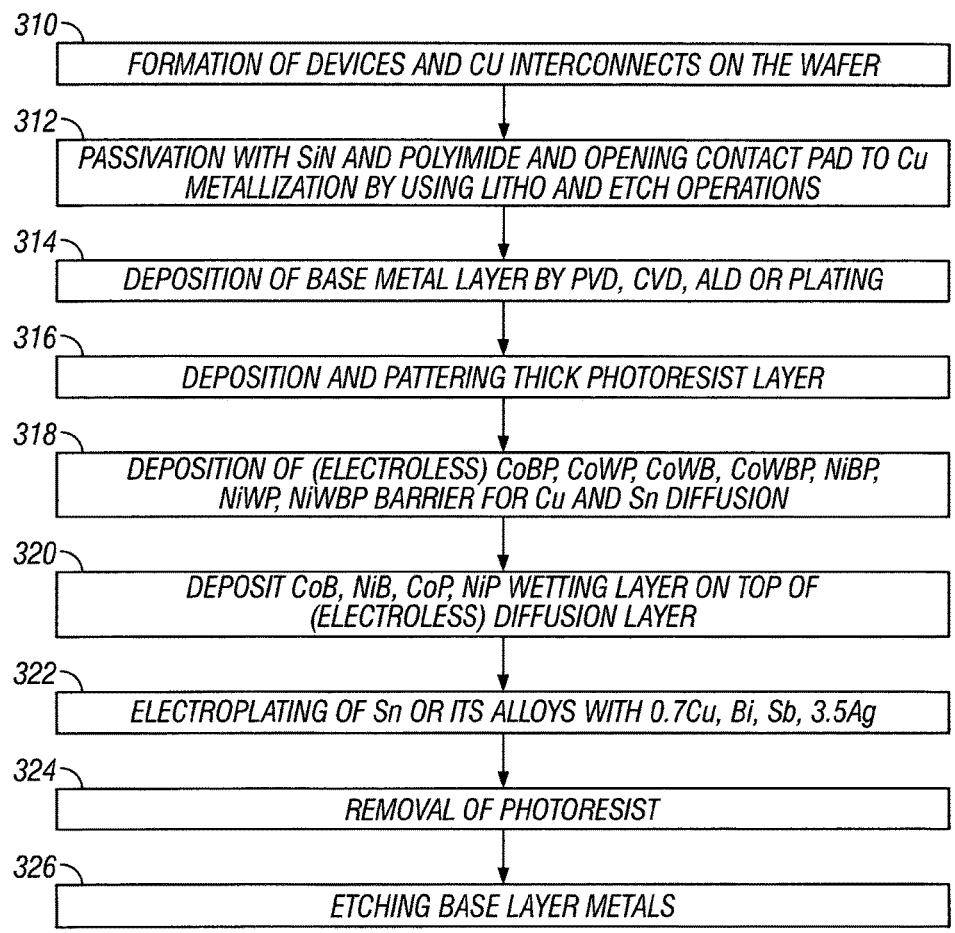
FIG. 3 is an exemplary flow diagram of the fabrication of the exemplary implementation shown in FIG. 2.

FIG. 3 is an exemplary flow diagram of the fabrication of the exemplary implementation shown in FIG. 2. One or more devices and Cu interconnects may be formed on the wafer at 310. The die package interconnect 200 may then be passivated with SiN and polyimide at 312. By using lithography and etching operations, a contact pad (not shown) may be opened for Cu metallization. The base layer metal 230 may be deposited using plasma vapor deposition (PVD), chemical vapor deposition (CVD), atomic layer deposition (ALD), or plating at 314. The base layer metal 230 may include an adhesion layer (e.g., Ti, TiN, or TiSiN) and a seed layer (e.g., Ni, NiV, or Co). An additional metal layer, such as Al, can be formed between the adhesion layer and the seed layer to improve barrier properties of the base layer metal 230.

A photoresist layer may then be deposited and patterned at 316. A diffusion barrier layer 225 can be formed at 318. The diffusion barrier layer 225 may be electroless and may include any one of CoBP, CoWP, CoWB, CoWBP, NiBP, NiWP, NiWB, and NiWBP. Then, a wetting layer can be deposited on the diffusion barrier layer 225 at 320. The wetting layer may include any one of CoB, NiB, CoP, and NiP. Electroplating of Sn or alloys of Sn can be performed at 322. Some alloys of Sn may include any one of 0.7 Cu, Bi, Sb, and 3.5 Ag. The photoresist may then be removed at 324 and the base layer metal 230 may be etched at 326.

Forming the die package interconnect 200 with the diffusion barrier layer 225 may entail using etching to pattern the base layer metal 230. The etching of the base layer metal 230 may reduce the degradation (e.g., corrosion or oxidation) of Sn bumps and polyimide.

Figure 4:
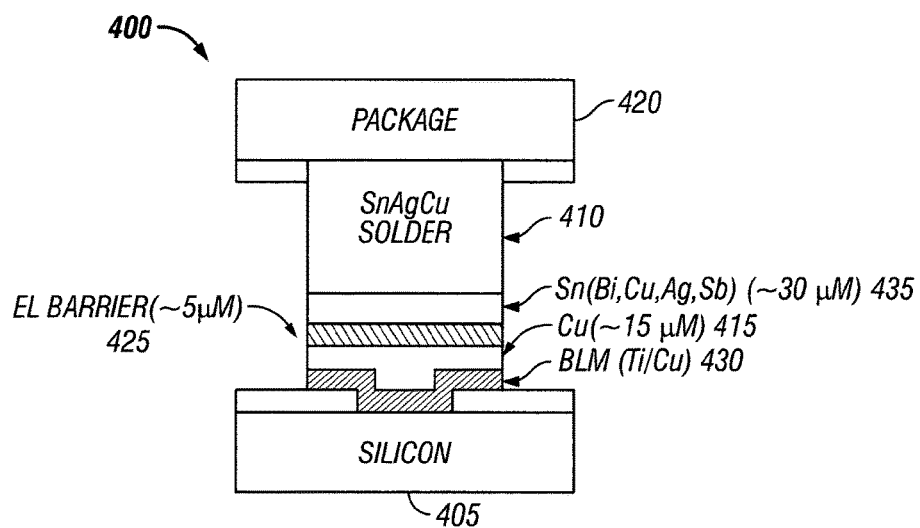
FIG. 4 shows an exemplary implementation of the fabricated structure.

FIG. 4 shows another exemplary implementation of the die package interconnect 400. The bump layer 415 is formed of Cu and is directly on top of the base layer metal 430. The base layer metal 430 may be Cu. The diffusion barrier layer 425 may be electroless and may be placed on top of the (Cu) bump layer 415 and below a layer of Sn or Sn alloy. The diffusion barrier layer 425 may provide advantages similar to the diffusion barrier layer 225 of interconnect 200 of FIG. 2. For example, the diffusion barrier layer 425 may prevent Cu and Sn diffusion or intermixing between the (Cu) bump layer 415 and the Sn layer 435 by preventing the diffusion of Cu and Sn through the diffusion barrier. The diffusion barrier layer 425 may prevent whisker formation in the bump layer 415. Although exemplary thicknesses of several layers 415, 425, 435 are shown in the diagram, layer thicknesses can vary from what is shown.

A solder layer 410 may be formed above the Sn layer 435 and a package layer 420 may be connected to the solder layer 410. The package layer 420 is electrically connected to all of the other conductive layers 410, 435, 425, 415, 430 in the interconnect 400, allowing current to flow between the die package and devices and interconnects near or on the substrate 405.

Figure 5:
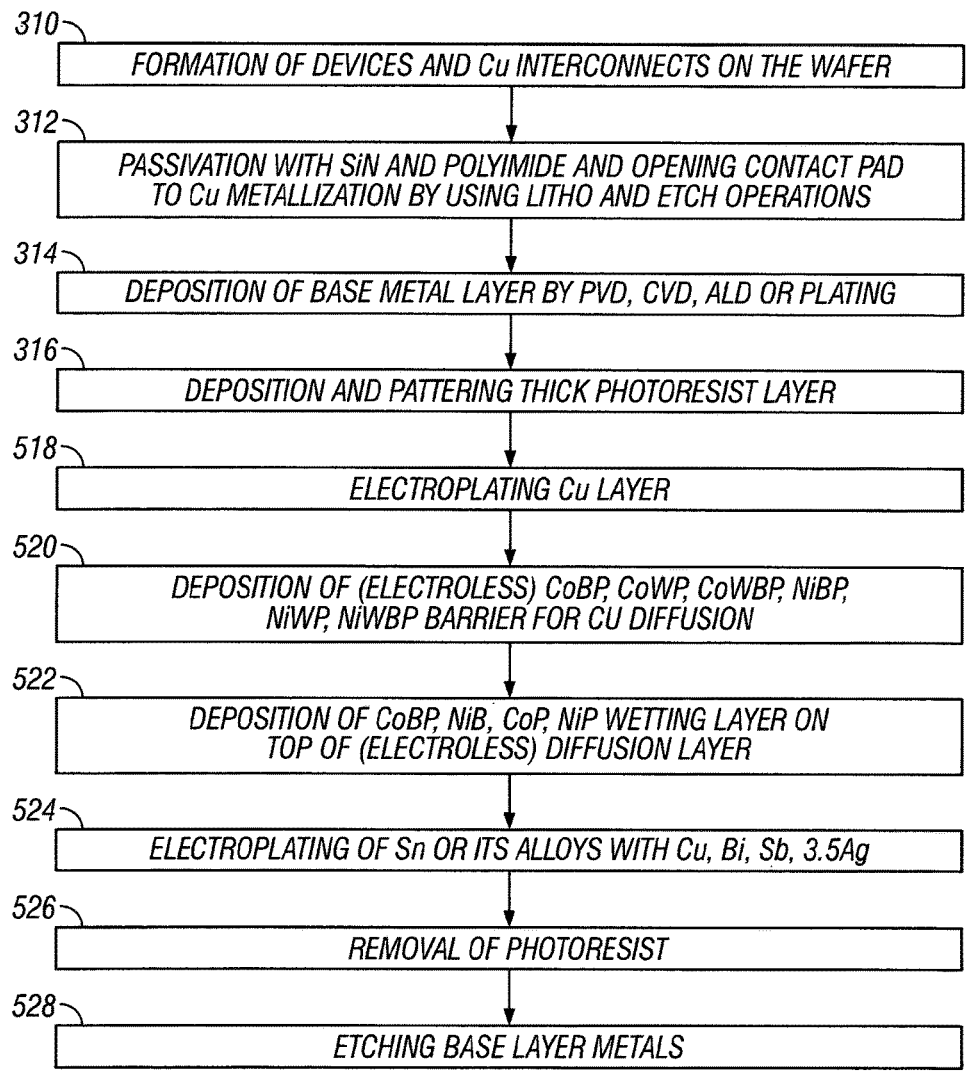
FIG. 5 is an exemplary flow diagram of the fabrication of the exemplary implementation shown in FIG. 4.

FIG. 5 shows an exemplary flow diagram of the fabrication of the exemplary implementation shown in FIG. 4. The process flow for interconnect 400 at 310, 312, 314, and 316 may occur in similar manners and orders as the process flow for interconnect 200 in FIGS. 2-3. At 518, a Cu bump layer 415 is formed and electroplated. Electroplating the Cu bump layer 415 may provide the uniform thickness, whisker formation suppression, and low to zero compressive stress advantages as electroplating the Sn bump layer 215 in FIG. 2. The diffusion barrier layer 425 may be electroless and may be formed on the bump layer 415 at 520 and a wetting layer (not shown in FIG. 4) is formed on top of the bump layer 415 at 522. The electroless diffusion barrier layer 425 may include any one of CoBP, CoWP, CoWB, CoWBP, NiBP, NiWP, NiWB, NiWBP, and the wetting layer may include any one of CoB, NiB, CoP, and NiP.

At 524, the Sn layer 435 is formed and electroplated on top of the wetting layer. Electroplating the Sn layer 435 may provide similar advantages as described above for electroplating Sn in interconnect 200. Such similar advantages may include suppression of whisker formation and preventing low temperature phase transition of Sn. The photoresist may be removed at 516 and the base layer metal 430 may be etched at 528. A solder layer 410 may be formed above the Sn layer 435 and a package layer 420 may be connected to the solder layer 410. The solder layer 410 may contain Sn and may also be electroplated.

Figure 6:
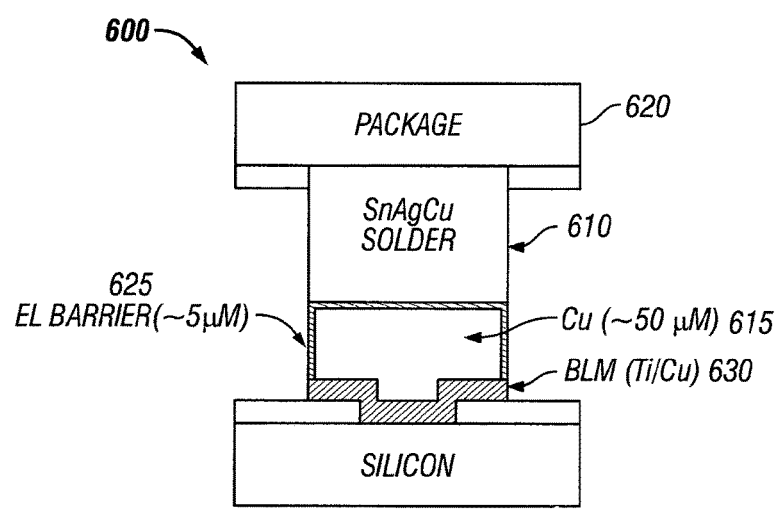
FIG. 6 shows an exemplary implementation of the fabricated structure.

FIG. 6 shows another exemplary implementation of the die package interconnect 600. The bump layer 615 may be formed of Cu and may be directly on top of the base layer metal 630. The base layer metal 630 may be Cu. The diffusion barrier layer 625 may be electroless and may be placed on top of a Cu bump layer 615 and below a layer of Sn or Sn alloy. The diffusion barrier layer 625 may surround the bump layer 615, with the base layer metal 630 contacting a bottom surface of the bump layer 615. All non-base layer metal 630 surfaces of the bump layer 615, including the top surface and sidewall surfaces, may be covered with the electroless diffusion barrier layer 625. Hence, the outer surface of the bump layer 615 may be physically isolated from direct physical contact with a layer that may include Sn. The electroless diffusion barrier layer 625 may provide advantages similar to those of interconnect 400 of FIG. 4. For example, the electroless diffusion barrier layer 625 may prevent Cu and Sn diffusion or intermixing between Cu in the bump layer 615 and Sn in a Sn layer 610, and may prevent whisker formation in the bump layer 615.

A solder layer 610 may be formed above the electroless diffusion barrier layer 625 and a package layer 620 may be connected to the solder layer 610. The solder layer 610 may include Sn and may be electroplated.

Figure 7:
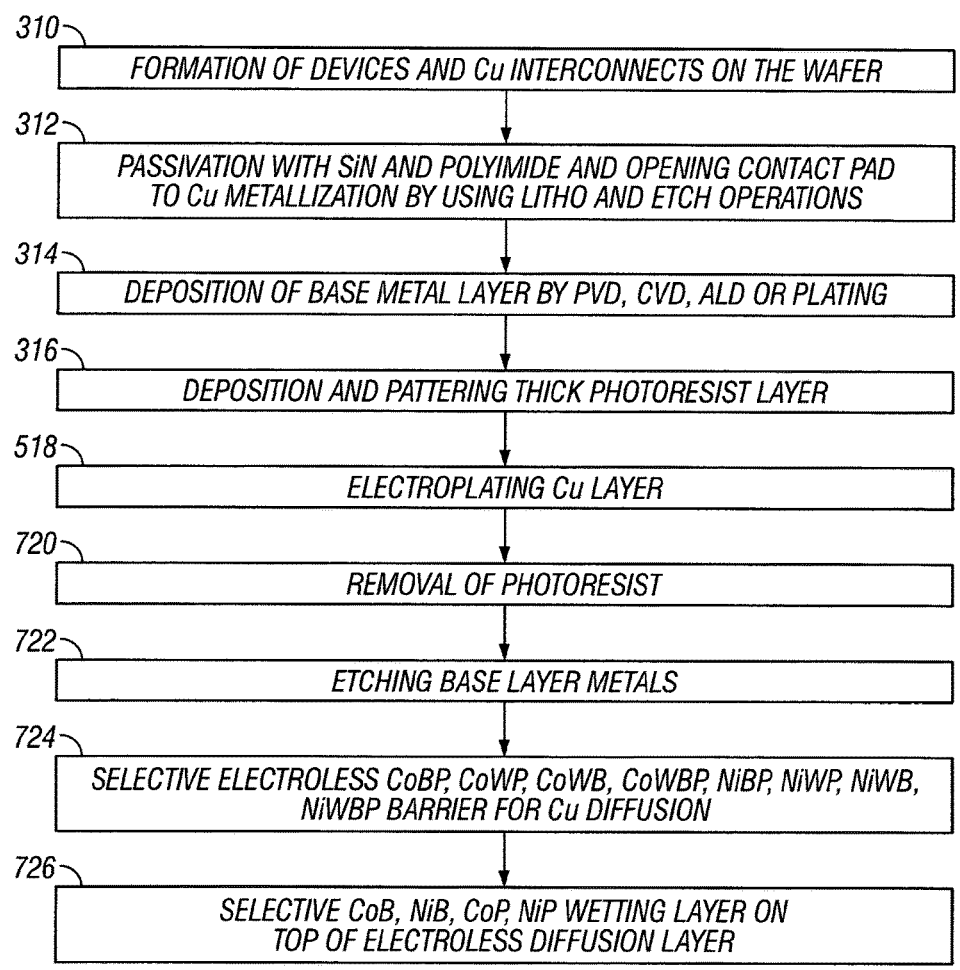
FIG. 7 is an exemplary flow diagram of the fabrication of the exemplary implementation shown in FIG. 6.

FIG. 7 shows an exemplary flow diagram of the fabrication of the exemplary implementation shown in FIG. 6. The processing flow for interconnect 600 at 310, 312, 314, 316 and 518 may occur in similar manners and orders as the processing flow for interconnect 400 in FIGS. 4-5. At 720, the photoresist may be removed and the base layer metal 630 may be etched at 722. The diffusion barrier layer 625 may be electroless and may be formed on the bump layer 615 at 724 and a wetting layer (not shown in FIG. 6) may be formed on top of the bump layer 615 at 726. The electroless diffusion barrier layer 625 may include any one of CoBP, CoWP, CoWB, CoWBP, NiBP, NiWP, NiWB, NiWBP, and the wetting layer may include any one of CoB, NiB, CoP, and NiP. Other conductive layers, such as the solder layer 610, may be formed on top of the electroless diffusion barrier layer 625 and the wetting layer, and can be contacted to a package layer 620.

Figure 8:
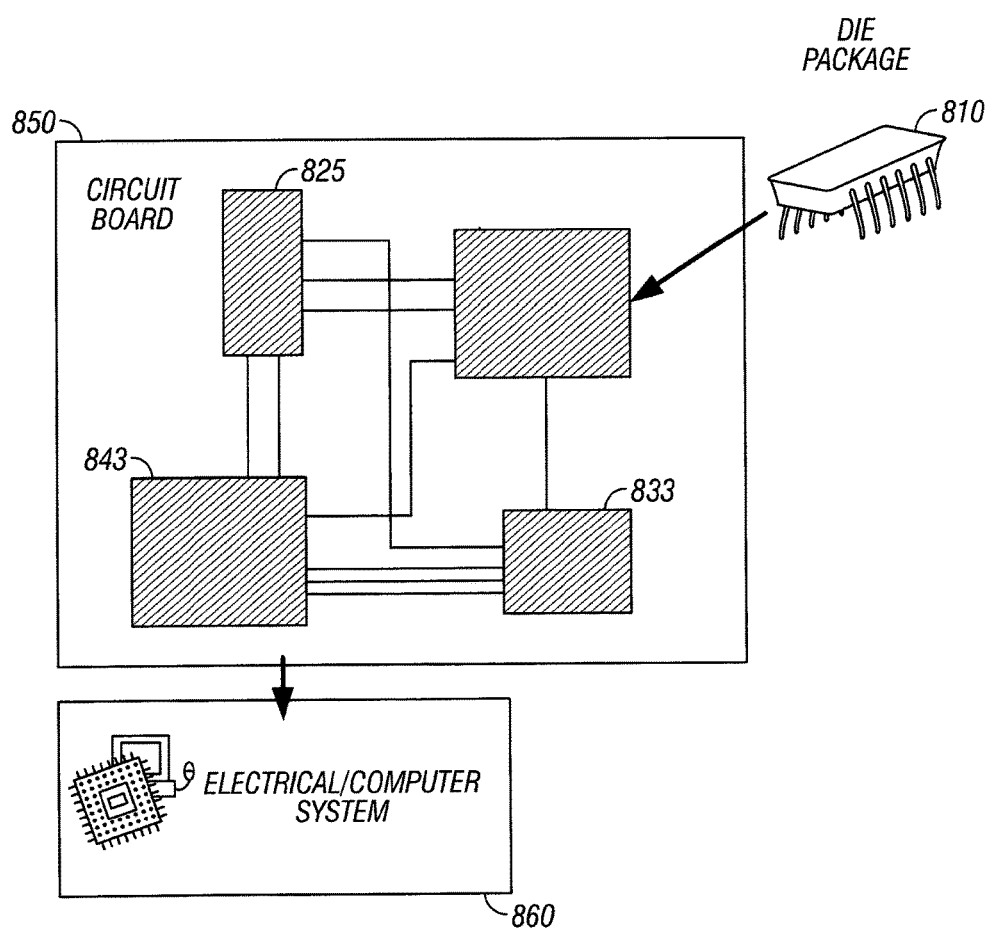
FIG. 8 shows an exemplary implementation of the die package structure in an electrical/computer system.

FIG. 8 shows an exemplary implementation of the die package structure in an electrical computer system. One or more interconnects and layers for a die package are formed on a substrate, as described above with respect to FIGS. 3, 5, and 7. When placed on a circuit board 850, the die package 810 can connect the internal circuitry within the die package with circuitry that is external to the die package and on the circuit board 850. The circuit board 850 may have other chips and components, such as a memory 843, a central processing unit (CPU) 825, and a controller or some other logic unit 833. The circuit board 850 may be made with multiple layers for routing signals between components, and may be used in a system of computers and/or electronics 860.

A number of implementations of the invention have been described. Nevertheless, it will be understood that various modifications may be made without departing from the spirit and scope of the invention. For example, the processing order may vary from the processing order shown in FIGS. 3, 5, and 7. In FIG. 7, for instance, after the Cu layer has been formed and electroplated 518 for interconnect 600, the electroless diffusion barrier layer 625 may be deposited 724. Following the formation 726 of the wetting layer on the electroless diffusion barrier layer 625, the photoresist may be removed 720 and the base layer metal 630 may be etched 722. In another example, an electroless barrier can be used to prevent the intermixing of other metals besides Cu and Sn, such as preventing the intermixing of Au and Al.

What is claimed is:

1. A method of forming an assembly, comprising:
providing a substrate, the substrate having a metal pad including aluminum, a base layer metal (BLM) disposed on the metal pad, the BLM including titanium, a bump disposed on the BLM, the bump including copper, and a first solder layer disposed on the bump, the first solder layer including tin and having a first material composition;
providing a die package, the die package having a first side and an opposing second side, and a second solder layer disposed on the first side of the die package, the second solder layer including tin and having a second material composition different from the first material composition, wherein one of the first solder layer or the second solder layer comprises an element not included in the other of the first solder layer or the second solder layer;
connecting the second solder layer of the die package to the first solder layer of the substrate to enable electrical current to flow between the die package and the substrate.

2. The method of claim 1, wherein the bump is disposed directly on the BLM.

3. The method of claim 1, wherein the base layer metal (BLM) further includes copper.

4. The method of claim 1, wherein the first solder layer further includes silver.

5. The method of claim 1, wherein the second solder layer on the die package further includes silver and copper.

6. The method of claim 1, wherein the substrate further comprises a diffusion barrier layer disposed between the bump and the first solder layer.

7. The method of claim 6, wherein the substrate further comprises a wetting layer disposed between the diffusion barrier layer and the first solder layer.

8. The method of claim 6, wherein the diffusion barrier layer includes phosphorous.

9. The method of claim 1, wherein the assembly is substantially free of lead.

10. The method of claim 1, wherein one of the first solder layer and the second solder layer comprises an element not included in the other of the first solder layer and the second solder layer.

11. A method of forming an assembly, comprising:
forming a metal pad on a substrate, the metal pad including aluminum;
forming a base layer metal (BLM) on the metal pad, the BLM including titanium;
forming a bump on the BLM, the bump including copper;
forming a first solder layer on the bump, the first solder layer including tin and having a first material composition;
forming a second solder layer on a side of a die package, the second solder layer including tin and having a second material composition different from the first material composition, wherein one of the first solder layer or the second solder layer comprises an element not included in the other of the first solder layer or the second solder layer; and
subsequent to forming the metal pad, the BLM, the bump, the first solder layer and the second solder layer, connecting the second solder layer of the die package to the first solder layer of the substrate to enable electrical current to flow between the die package and the substrate.

12. The method of claim 11, wherein the bump is formed directly on the BLM.

13. The method of claim 11, wherein the base layer metal (BLM) further includes copper.

14. The method of claim 11, wherein the first solder layer further includes silver.

15. The method of claim 11, wherein the second solder layer formed on the die package further includes silver and copper.

16. The method of claim 11, further comprising:
forming a diffusion barrier layer on the bump, wherein the first solder layer is formed on the diffusion barrier layer.

17. The method of claim 16, further comprising:
forming a wetting layer on the diffusion barrier layer, wherein the first solder layer is formed on the wetting layer.

18. The method of claim 16, wherein the diffusion barrier layer includes phosphorous.

19. The method of claim 11, wherein the assembly is substantially free of lead.

20. The method of claim 11, wherein one of the first solder layer and the second solder layer comprises an element not included in the other of the first solder layer and the second solder layer.

* * * * *